United States Patent [19]
Baldwin et al.

[11] Patent Number: 5,311,045
[45] Date of Patent: May 10, 1994

[54] FIELD EFFECT DEVICES WITH ULTRA-SHORT GATES

[75] Inventors: Kirk W. Baldwin, Springfield; Loren N. Pfeiffer, Morristown; Horst L. Stormer, Summit; Kenneth W. West, Mendham, all of N.J.

[73] Assignee: AT&T Bell Laboratories, Murray Hill, N.J.

[21] Appl. No.: 997,816

[22] Filed: Dec. 29, 1992

Related U.S. Application Data

[62] Division of Ser. No. 745,589, Aug. 15, 1991.

[51] Int. Cl.$^5$ .................. H01L 31/072; H01L 31/109; H01L 29/06
[52] U.S. Cl. ..................... 257/192; 257/194; 257/20; 257/29
[58] Field of Search ............... 257/192, 194, 14, 20, 257/26, 27, 29

[56] References Cited

U.S. PATENT DOCUMENTS

| | | | |
|---|---|---|---|
| 4,683,642 | 8/1987 | Calviello | 437/40 |
| 4,701,996 | 10/1987 | Calviello | 257/192 |
| 4,791,072 | 12/1988 | Kiehl | 257/194 |
| 4,795,717 | 1/1989 | Okamura | 257/194 |
| 4,821,093 | 4/1989 | Iafrate et al. | 257/192 |
| 4,882,609 | 11/1989 | Schubert et al. | 257/194 |
| 5,023,674 | 6/1991 | Hikosaka et al. | 257/194 |
| 5,130,766 | 7/1992 | Arimoto et al. | 257/192 |

OTHER PUBLICATIONS

Pfeiffer et al. "Formation of High Quality Two-Dimensional Electron Gas on Cleaved GaAs," 56 *Applied Physics Letters* 17 (Apr. 20, 1990).
Hartstein, et al, "A metal-oxide-semiconductor field-effect transistor with a 20-nm channel length", *J. Appl. Phys.* 68 (Sep. 1, 1990).
Stormer et al, "Atomically precise superlattice potential imposed on a two-dimensional electron gas", 58 *Appl. Phys. Lett.* 7 (Feb. 18, 1991).
Hartstein, "Quantum Interference in an Ultra-Short Channel Si Mosfet", *The Physics of Semiconductors*, vol. 2 (Aug. 1990), pp. 1689-1692.

*Primary Examiner*—Rolf Hille
*Assistant Examiner*—Wael Fahmy
*Attorney, Agent, or Firm*—Glen E. Books

[57] ABSTRACT

The present invention is a method for making field effect devices, such as a field effect transistors, having ultrashort gate lengths so low as five hundred angstroms or less. In accordance with the invention the gate structure is grown vertically on a substrate by thin film deposition so that the length dimension of the gate is perpendicular to a major surface of the substrate. An edge of the gate-containing substrate is exposed, and the structure comprising the source, drain and channel is grown on the edge. Using this approach, field effect devices with precisely controlled gate lengths of less than 100 angstroms are achievable. Moreover the active regions of the device can be immersed within semiconductor material so that surface properties do not deteriorate device performance.

4 Claims, 2 Drawing Sheets

FIELD EFFECT DEVICES WITH ULTRA-SHORT GATES

This is a division of application Ser. No. 07/745,589 filed Aug. 15, 1991.

FIELD OF THE INVENTION

This invention relates to a method for making field effect devices with ultrashort gates and to devices made thereby.

BACKGROUND OF THE INVENTION

Field effect devices, such as field effect transistors, are fundamental components in modern electronics. They are basic components in most digital and many analog circuits, including circuits for data processing and telecommunications. Indeed it has been surmised that field effect transistors are among the most numerous of man-made objects.

Field effect devices typically comprise a conductive path between a source and a drain. A region of the path between the source and the drain, called the channel, is under the control of the electric field produced by a gate electrode. For example, the source and the drain can be n-type regions in the surface of a semiconductor substrate and the channel can be a shallow n-type region connecting them. A gate electrode formed on a thin insulator overlying the channel can be used to control the electrical properties of the channel. If no voltage is applied to the gate, current can flow from the source through the channel to the drain. However if a sufficient negative voltage is applied to the gate, electrons will be forced from the channel region, thereby depleting it of carriers and reducing or even shutting off the source-drain current. The highest operating frequency of such a device and, concomitantly its speed as a switch, is determined in large part by the shortness of the gate-channel region.

While reduction in gate length is one of the most effective ways to improve the high frequency performance and speed of field effect devices, further reduction in gate length has become increasingly difficult. The conventional approach to gate fabrication involves applying thin layers of insulator and conductor to a substrate and then defining the laterally extending gate structure by electron beam lithography. While electron beam lithography has, at considerable expense, reduced gate length as compared with the prior photolithographic processes, reproducible feature size is presently limited to dimensions of several hundred angstroms.

SUMMARY OF THE INVENTION

The present invention is a method for making field effect devices, such as a field effect transistors, having ultrashort gate lengths so low as five hundred angstroms or less. In accordance with the invention the gate structure is grown on a substrate by thin film deposition so that the length dimension of the gate is perpendicular to a major surface of the substrate. An edge of the gate-containing substrate is exposed, and the structure comprising the source, drain and channel is grown on the edge. Using this approach, field effect devices with precisely controlled gate lengths of less than 100 angstroms are achievable. Moreover the active regions of the device can be immersed within semiconductor material so that surface properties do not deteriorate device performance.

BRIEF DESCRIPTION OF THE DRAWING

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for graphical illustrations, are not to scale.

DETAILED DESCRIPTION

Figure 1:
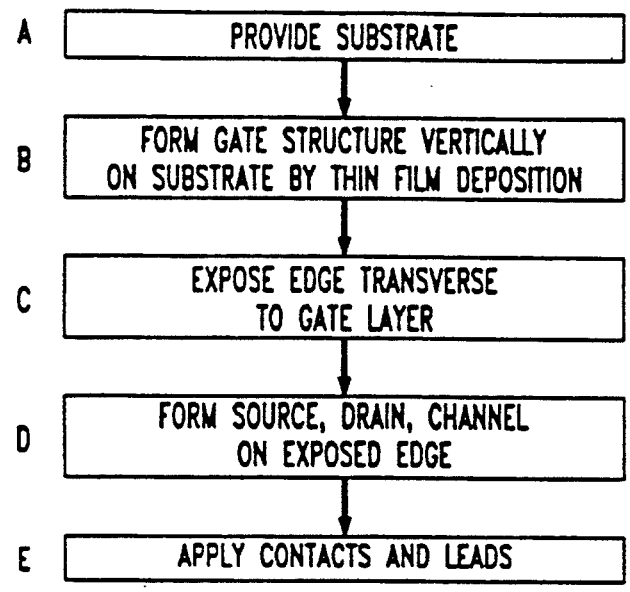
FIG. 1 is a flow diagram showing the preferred process steps used to make a field effect device.
Figure 2:
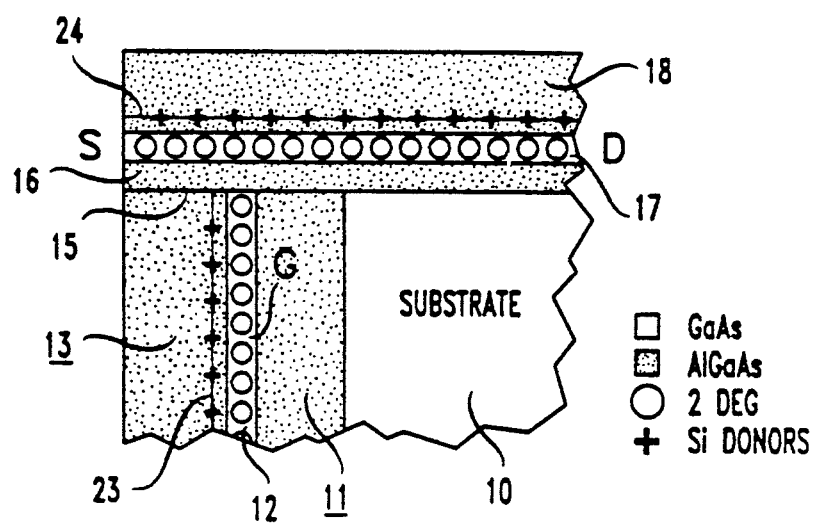
FIG. 2 is a schematic cross section of a preferred field effect device made by the process of FIG. 1.

Referring to the drawings, FIG. 1 illustrates the steps in making a field effect device, and FIG. 2 is a schematic cross section of an exemplary field effect device made in accordance with the process of FIG. 1.

As shown in FIG. 1A the first step is to provide a substrate (10 of FIG. 2) which is preferably an undoped monocrystalline semiconductor, such as gallium arsenide, having a pair of major surfaces.

The second step, shown in FIG. 1B, is to deposit the gate structure on the substrate by thin film deposition so that the length dimension of the gate is perpendicular to a major surface of the substrate 10. The gate structure is a thin conductive layer 12 disposed between a pair of spacer layers 11 and 13 of non-conductive material. Preferably layer 12 is a two dimensional electron gas layer comprised of a quantum well. Electrons for the well can be provided by delta doping of the adjacent spacer layers 11, 13. Alternatively, dopants can be introduced directly into the quantum well. The structure can be conveniently deposited using molecular beam epitaxy (MBE) to grow on the substrate 10 an inner spacer layer 11 such as aluminum gallium arsenide, a conductive gate layer 12 such as a gallium arsenide quantum well region and an outer spacer layer 13 such as aluminum gallium arsenide. One or both of the spacer layers 11, 13 can include delta doping 23 with donors, such as silicon, to provide electrons to well 12. The gate layer 12 is advantageously less than about 500 angstroms thick.

As shown in FIG. 1C, the next step is to expose an edge 15 of the resulting structure transverse to the first conductive layer 12. The substrate is preferably cleaved to provide a pristine edge surface 15. Alternatively the workpiece can be etched to expose an edge transverse to layer 12.

The fourth step, shown in FIG. 1D, is to deposit on the exposed edge 15 of the gate-containing substrate, the source, drain and channel structure comprising a third spacer layer 16 of non-conductive material, a second thin conductive layer 17 and an outer spacer layer 18 of non-conductive material.

Spacer layer 16 can be deposited by growing aluminum gallium arsenide on the exposed edge surface transverse to gate layer 12. Conductive source-drain-channel layer 17 is preferably a second two dimensional electron gas layer comprising a quantum well region, such as gallium arsenide, grown on layer 16, and outer spacer layer 18 can be aluminum gallium arsenide grown over conductive layer 17. One or both of the spacer regions 16, 18 can include delta doping 24 with donors to provide electrons to well 17. Spacer 16 is advantageously less than about 250 angstroms thick.

Figure 3:
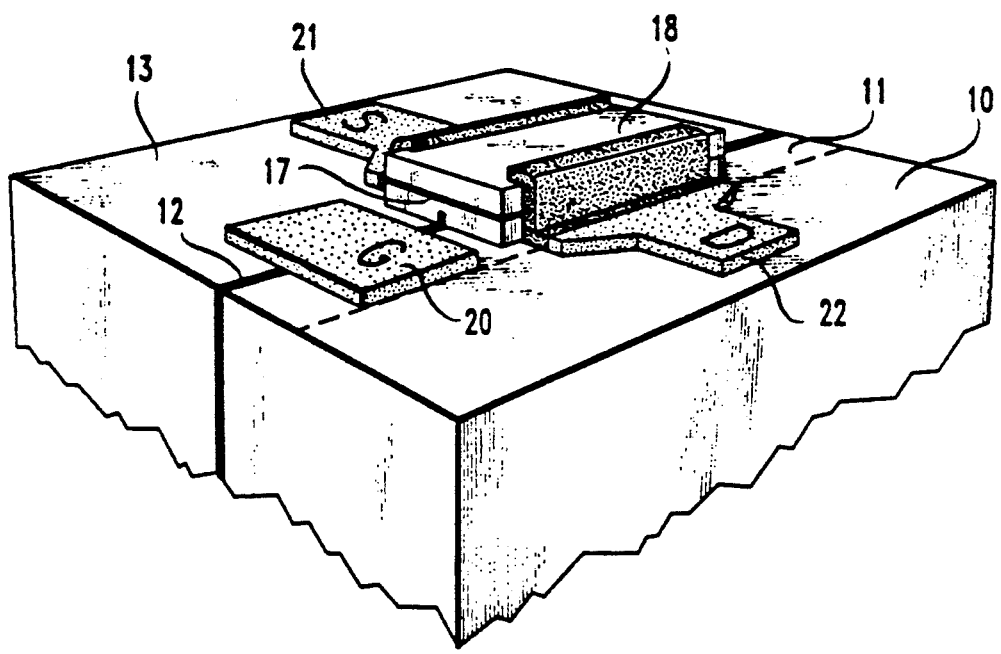
FIG. 3 is a perspective view of the device of FIG. 2 showing electrical contacts.

As shown in FIG. 1E, the final step is to provide electrical contacts to gate layer 12 and to source-drain layer 17 on opposite sides of the gate, thereby defining the gate, source and drain, respectively, of a field effect device. FIG. 3 is a perspective view of the metallized device of FIG. 1 showing the gate contact 20, the source contact 21, and the drain contact 22. Preferably contacts are made with the quantum well electron gas regions 12 and 17 by depositing AuGeNi ohmic contacts and an outer layer of subsequently deposited gold can lead away from the contacts. The contacts and leads are deposited and configured by techniques well known in the art. The resulting structure acts as a depletion mode field-effect transistor.

The described method and resulting device have several significant advantages over the conventional methods and devices. Foremost, the width of the gate is controlled not by lithography but rather by the thickness of the deposited layers 12 and 17. In contrast with lithography, thin film deposition techniques such as molecular beam epitaxy permit the fabrication of atomically smooth layers of atomically precise thickness. Thus atomically precise gate lengths of less than 500 angstroms and even less than 100 angstroms can be achieved by this method. Since the conductive layers are remotely doped and are free of mobility-reducing dopant ions, the carriers have a high mobility, leading to low resistance of the gate and the source-drain channel.

Secondly with this method the active region of the field effect device—the region constituting the gate controlled channel—is completely immersed within non-conductive material, e.g. the aluminum gallium arsenide spacer layers. Surface properties and Schottky barriers do not deteriorate device performance.

The structure, fabrication and operation of the invention can be understood in greater detail by consideration of the following specific example.

An embedded gate structure is formed by providing a (100) gallium arsenide substrate and growing on the substrate by molecular beam epitaxy (MBE), the following sequence of layers: 4.3 micrometers of undoped $Al_{0.3}Ga_{0.7}As$, 200 angstroms of undoped GaAs, 150 angstroms of $Al_{0.3}Ga_{0.7}As$, a delta doped silicon layer of a concentration $1.5 \times 10^{12}$ cm$^{-2}$, and 20 micrometers of undoped $Al_{0.3}Ga_{0.7}As$. The 200 angstrom layer of GaAs is a quantum well containing a two-dimensional electron gas. It is buried 20 micrometers below the surface and acts as a gate. The electron gas quantum well region has a carrier density at 77K of about $4.3 \times 10^{11}$ cm$^{-2}$ and a mobility of about $1.3 \times 10^5$ cm$^2$/V sec.

Preliminary to forming the channel, source and drain structure, the gallium arsenide substrate can be thinned, as by lapping from the backside, to a thickness of about 150 micrometers, and cleaved into a rectangular piece approximately 5 mm by 10 mm. The substrate is preferably cleaved in situ within an MBE growth chamber to expose a pristine (110) surface transverse and substantially perpendicular to the plane of the 200 angstrom electron gas quantum well region. The procedural details and apparatus required for this in situ cleaving process are described in Pfeiffer et al, "Formation of a High Quality Two-Dimensional Electron Gas on Cleaved GaAs," 56 *Applied Physics Letters* 17 (Apr. 20, 1990).

The source, drain channel structure is then grown on the freshly cleaved edge by MBE deposition of a 200 angstrom layer of an undoped $Al_{0.44}Ga_{0.56}As$ spacer, a 150 angstrom undoped GaAs quantum well, a 150 angstrom undoped $Al_{0.3}Ga_{0.7}As$ spacer layer, followed by a Si delta-doped layer of concentration $2 \times 10^{12}$ cm$^{-2}$, 1700 angstroms of undoped $Al_{0.3}Ga_{0.7}As$ and 600 angstroms of undoped GaAs. This process generates a 150 angstrom wide modulation-doped quantum well source-drain channel separated from the gate 12 by a 200 angstrom AlGaAs layer. The estimated electron density for the electron gas quantum well at 77K is $1.5 \times 10^{11}$ cm$^{-2}$ with mobility $3.9 \times 10^4$ cm$^2$/V sec.

Figure 4:
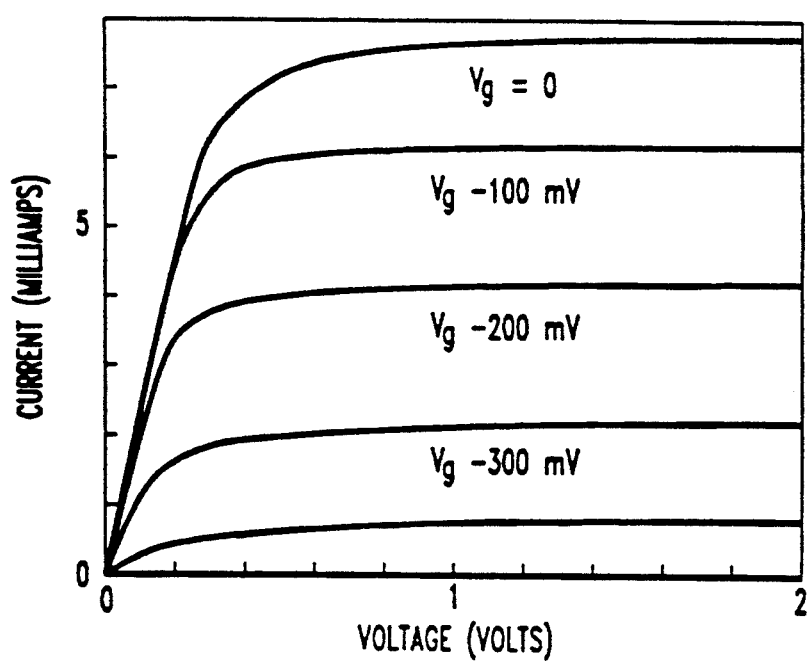
FIG. 4 shows the current-voltage characteristics of a field effect device of the type shown in FIGS. 2 and 3.

The structure is then metallized as illustrated and described in relation to FIG. 3 and operated at 77K as a depletion mode field effect transistor. FIG. 4 shows the transistor characteristics of the device at 77K. The transistor exhibits a transconductance of 196 mS/mm.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. A field effect device comprising:
   a gate comprising a first quantum well layer containing a two dimensional electron gas, said layer having a thickness of less than about 500 angstroms;
   first and second spacer layers of non-conductive material disposed on either side of said gate;
   a source and drain comprising a second quantum well layer containing a two dimensional electron gas, said second quantum well layer disposed transverse to said gate so that the gate thickness extends in the direction between the source and the drain, and a third spacer layer of non-conductive material spacing said second quantum well layer from said first quantum well layer.

2. A device according to claim 1 wherein:
   said first and second quantum well layers comprise gallium arsenide.

3. A device according to claim 1 further comprising a layer of non-conductive material epitaxially grown on said second quantum well layer so as to substantially enclose the active region of said device within a body of non-conductive material comprising said first, second and third spacer layers.

4. A device according to claim 2 wherein said quantum well layers comprise gallium arsenide and said spacer layers comprise aluminum gallium arsenide.

* * * * *